United States Patent
Ning et al.

(10) Patent No.: US 9,870,519 B2
(45) Date of Patent: Jan. 16, 2018

(54) HIERARCHICAL SPARSE DICTIONARY LEARNING (HISDL) FOR HETEROGENEOUS HIGH-DIMENSIONAL TIME SERIES

(71) Applicant: NEC Laboratories America, Inc., Princeton, NJ (US)

(72) Inventors: Xia Ning, Indianapolis, IN (US); Guofei Jiang, Princeton, NJ (US); Xiao Bian, Raleigh, NC (US)

(73) Assignee: NEC Corporation, Tokyo (JP)

( * ) Notice: Subject to any disclaimer, the term of this patent is extended or adjusted under 35 U.S.C. 154(b) by 302 days.

(21) Appl. No.: 14/794,487

(22) Filed: Jul. 8, 2015

(65) Prior Publication Data

US 2016/0012334 A1  Jan. 14, 2016

Related U.S. Application Data

(60) Provisional application No. 62/021,781, filed on Jul. 8, 2014.

(51) Int. Cl.
*G06F 17/00* (2006.01)
*G06N 5/02* (2006.01)
(Continued)

(52) U.S. Cl.
CPC .......... *G06K 9/6244* (2013.01); *G06F 17/14* (2013.01); *G06K 9/00369* (2013.01); *G06K 9/62* (2013.01);
(Continued)

(58) Field of Classification Search
CPC combination set(s) only.
See application file for complete search history.

(56) References Cited

U.S. PATENT DOCUMENTS 8,874,432 B2 * 10/2014 Qi ................. G06F 17/271
704/9
9,418,318 B2 * 8/2016 Nadar ............... G06K 9/645
(Continued)

OTHER PUBLICATIONS

Learning structured dictionaries for image representation Monaci; P. Vandergheynst Image Processing, 2004. ICIP '04. 2004 International Conference on Year: 2004, vol. 4 pp. 2351-2354 vol. 4, DOI: 10.1109/ICIP.2004.1421572 IEEE Conference Publications.*
(Continued)

*Primary Examiner* — Michael B Holmes
(74) *Attorney, Agent, or Firm* — Joseph Kolodka

(57) ABSTRACT

A system, method and computer program product for hierarchical sparse dictionary learning ("HiSDL") to construct a learned dictionary regularized by an a priori over-complete dictionary, includes providing at least one a priori over-complete dictionary for regularization, performing sparse coding of the at least one a priori over-complete dictionary to provide a sparse coded dictionary, using a processor, updating the sparse coded dictionary with regularization using at least one auxiliary variable to provide a learned dictionary, determining whether the learned dictionary converges to an input data set, and outputting the learned dictionary regularized by the at least one a priori over-complete dictionary when the learned dictionary converges to the input data set. The system and method includes, when the learned dictionary lacks convergence, repeating the steps of performing sparse coding, updating the sparse coded dictionary, and determining whether the learned dictionary converges to the input data set.

20 Claims, 3 Drawing Sheets

(51) Int. Cl.
*G06K 9/62* (2006.01)
*G06N 99/00* (2010.01)
*G06F 17/14* (2006.01)
*H03M 7/30* (2006.01)
*G06K 9/00* (2006.01)

(52) U.S. Cl.
CPC ............ *G06N 99/005* (2013.01); *H03M 7/30* (2013.01); *H03M 7/3062* (2013.01); *H03M 7/3082* (2013.01); *H03M 7/3088* (2013.01)

(56) References Cited

U.S. PATENT DOCUMENTS

| | | | | |
|---|---|---|---|---|
| 2011/0270604 | A1* | 11/2011 | Qi | G06F 17/271 704/9 |
| 2015/0063687 | A1* | 3/2015 | Nadar | G06K 9/645 382/159 |
| 2016/0012334 | A1* | 1/2016 | Ning | G06N 99/005 706/46 |

OTHER PUBLICATIONS

Learning structured dictionaries for image representation G. Monaci; P. Vandergheynst Image Processing, 2004. ICIP '04. 2004 International Conference on Year: 2004, vol. 4 pp. 2351-2354 vol. 4 IEEE Conference Publications.*

Sparse Bayesian dictionary learning with a Gaussian hierarchical model Linxiao Yang; Jun Fang; Hongbin Li 2016 IEEE International Conference on Acoustics, Speech and Signal Processing (ICASSP) Year: 2016 pp. 2564-2568 IEEE Conference Publications.*

Sparse, Hierarchical and Semi-Supervised Base Learning for Monaural Enhancement of Conversational Speech Felix Weninger; Martin Woellmer; Bjoern Schuller Speech Communication; 10. ITG Symposium Year: 2012 pp. 1-4 VDE Conference Publications.*

Blind Separation of Image Sources via Adaptive Dictionary Learning Vahid Abolghasemi; Saideh Ferdowsi; Saeid Sanei IEEE Transactions on Image Processing Year: 2012, vol. 21, Issue: 6 pp. 2921-2930 IEEE Journals & Magazines.*

Aharon, M., et al., "K-SVD: An Algorithm for Designing Overcomplete Dictionaries for Sparse Representation," IEEE Transactions on Signal Processing, vol. 54, No. 11, Nov. 2006. (pp. 4311-4322).

Elad, M., et al., "Image Denoising Via Sparse and Redundant Representations Over Learned Dictionaries," IEEE Transactions on Image Processing, vol. 15, No. 12, Dec. 2006. (pp. 3736-3745).

Mairal, J., et al., "Online Dictionary Learning for Sparse Coding," Proceedings of the 26th Annual International Conference on Machine Learning, Jun. 2009. (pp. 1-8).

Rubinstein, R., et al., "Double Sparsity: Learning Sparse Dictionaries for Sparse Signal Approximation," IEEE Transactions on Signal Processing, vol. 58, No. 3, Nov. 2009. (pp. 1-11).

* cited by examiner

HIERARCHICAL SPARSE DICTIONARY LEARNING (HISDL) FOR HETEROGENEOUS HIGH-DIMENSIONAL TIME SERIES

RELATED APPLICATION INFORMATION

This application claims priority to provisional application Ser. No. 62/021,781 filed on Jul. 8, 2014, which is incorporated herein by reference.

BACKGROUND

Technical Field

The present disclosure relates to hierarchical sparse dictionary learning ("HiSDL"). More particularly, the present disclosure is related to a hierarchical sparse system and method to characterize given data, including high-dimensional time series, for outputting an interpretable dictionary which is adaptive to given data and generalizable by a priori dictionaries.

Description of the Related Art

Sparse coding plays a key role in high dimensional data analysis. In particular, sparse coding is a class of unsupervised methods for learning sets of over-complete bases to represent data efficiently. There is an advantage of having an over-complete bases in sparse coding to capture structures and patterns inherent in the input data, with the additional criterion of sparsity to resolve the degeneracy introduced by over-completeness.

Similarly, sparse representation has been proven to be very powerful in analyzing high dimensional signals, where typically each signal is represented as a linear combination of a few atoms in a given over-completed dictionary. For example, the sparse representation problem may be formulated as:

$$\hat{w} = \arg\min_{w} \|w\|_0 \quad \text{s.t.} \quad \|Dw - x\| \leq \sigma, \quad (1)$$

where x is a signal vector such that $x \in R^d$, $R^d$ is a vector of d real numbers, $\sigma$ is a threshold value which may control the difference between Dw and x (e.g., a small positive number), D is a dictionary, $\hat{w}$ is a the optimal estimation of w, and w is a pursued sparse code. The pursued sparse code w may be considered a robust representation of x, and therefore can be used for clustering, classification, and denoising. It is noted that variables defined herein have the same meaning throughout unless otherwise indicated.

Generally, there are two major approaches to construct an over-completed dictionary that is suitable for sparse representation, namely an analytic-based approach and a learning-based approach. In an analytic-based approach, the dictionary is carefully designed a priori, e.g., with atoms such as wavelets, curvelets, and shealets. These handcrafted dictionaries are then applied to different signals. One of the advantages of the analytic-based approach is that the dictionary can be designed to be well-conditioned for stable representation, for instance, to have a better incoherence condition or restricted isometric property.

In a learning-based approach, the dictionary is learned from the given signals. Compared to the analytic approach, the learned dictionaries are usually more adaptive to the given signals, and therefore lead to a sparser and more robust representation. The learning-based approach outperforms analytic-based approaches in many tasks, such as denoising, classification, etc. However, the dictionary learning problem is non-convex, which is usually formulated as follows:

$$\{\hat{D}, \hat{W}\} = \arg\min_{D \in C, W} \|X - DW\|_F^2 \quad \text{s.t.} \quad \|W\|_0 \leq k, \quad (2)$$

where X is the data set, $\hat{D}$ is the optimal estimation of dictionary D, $\hat{W}$ is the optimal estimation of W, W is the data representation over the dictionary D, that is, after the dictionary D is learned, each data point can be represented as a combination of the dictionary atoms, and W represents the combination (e.g., the coding), k is the number of non-zero values in a matrix, and C is the constraint such that $D \in C$. Therefore, under the learning-based approach, it is very difficult to find the global optimal solution (e.g., selection from a given domain which provides the highest or lowest value) or local optimum solution (e.g., selection for which neighboring selections yield values that are not greater or smaller) close enough when the function is applied.

Additional common problems associated with the prior approaches includes overfitting, which may occur when a statistical model describes random error or noise instead of the underlying relationship. Overfitting may lead to poor predictive performance and generally occurs when a model is excessively complex, such as having too many parameters relative to the number of observations. Prior approaches, therefore, do not provide a dictionary that is both adaptive to the given data and regularized by a priori hand-crafted over-completed dictionaries. Moreover, prior approaches fail to provide methods that can properly handle high dimensional and heterogeneous time series to derive meaningful information from them.

SUMMARY

According to an aspect of the present principles, a method is provided in a computer processing system that may construct a learned dictionary regularized by an a priori over-complete dictionary for hierarchical sparse dictionary learning ("HiSDL"). The method includes providing at least one a priori over-complete dictionary for regularization, performing sparse coding of the at least one a priori over-complete dictionary to provide a sparse coded dictionary, and, using a processor, updating the sparse coded dictionary with regularization using auxiliary variables to provide a learned dictionary. In yet another aspect of the present disclosure, the method may further include determining whether the learned dictionary converges to an input data set, and outputting the learned dictionary regularized by the at least one a priori over-complete dictionary when the learned dictionary converges to the input data set.

According to another aspect of the present principles, a system is provided that may construct a learned dictionary regularized by an a priori over-complete dictionary for HiSDL. The system includes an a priori over-complete dictionary generator configured to provide at least one a priori over-complete dictionary for regularization, a sparse coder configured to perform sparse coding of the at least one a priori over-complete dictionary to provide a sparse coded dictionary, and a dictionary updater configured to update the sparse coded dictionary with regularization using at least one auxiliary variable to provide a learned dictionary. The system further includes a convergence determination device configured to determine convergence of the learned dictionary to an input data set, and an output device configured to output the learned dictionary regularized by the at least one a priori over-complete dictionary when the learned dictionary converges to the input data set.

According to another aspect of the present principles, a computer program product is provided that, when implemented, may construct a learned dictionary regularized by an a priori over-complete dictionary for HiSDL. The computer program product may include a non-transitory computer readable storage medium having computer readable program code embodied therein for providing at least one a priori over-complete dictionary for regularization, performing sparse coding of the at least one a priori over-complete dictionary to provide a sparse coded dictionary, and, using a processor, updating the sparse coded dictionary with regularization using at least one auxiliary variables to provide a learned dictionary. In yet another aspect of the present disclosure, the computer program product may further include determining whether the learned dictionary converges to an input data set, and outputting the learned dictionary regularized by the at least one a priori over-complete dictionary when the learned dictionary converges to the input data set.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
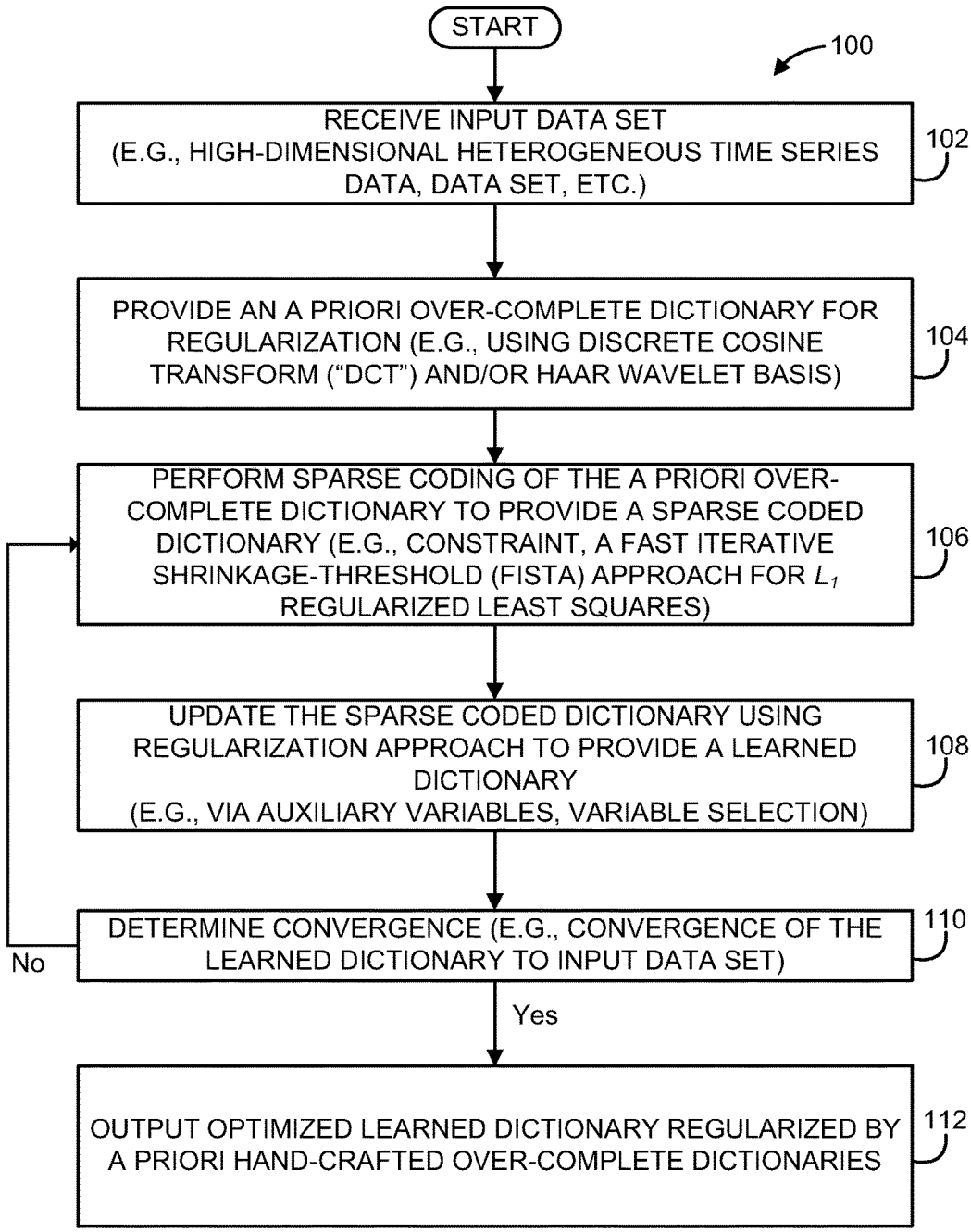
FIG. 1 is a block diagram illustratively depicting an exemplary method for constructing a learned dictionary regularized by at least one a priori over-complete dictionary, in accordance with one embodiment.

In accordance with the present principles, systems and methods are provided for hierarchical sparse dictionary learning ("HiSDL") for heterogeneous high-dimensional time series. Generally, time series may refer to a sequence of data points including successive measurements made over a period of time or during a specific time interval.

Advantageously, the present principles provide a hierarchical sparse dictionary that may be learned and may be built upon a priori over-completed dictionaries for sparse representation, thereby being adaptive to data while imposing a hierarchical structure on the learning model. In addition, the present principles may reduce overfitting, enhance the generalizability of the learned dictionary, and may provide a more compact dictionary and more robust sparse representation (e.g., clustering performance) with less computational cost. Moreover, the present principles may characterize high-dimensional time series, where the time series data exhibits high heterogeneity in nature, e.g., continuous versus discrete, smooth versus non-smooth, stationary versus non-stationary, etc.

It should be understood that embodiments described herein may be entirely hardware or may include both hardware and software elements, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory ("RAM"), a read-only memory ("ROM"), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring to the drawings in which like numerals represent the same or similar elements and initially to FIG. 1, a method for hierarchical sparse dictionary learning for heterogeneous high-dimensional time series 100 utilizing an a priori over-completed dictionary $\Phi$ to construct a learned dictionary is illustratively depicted according to one embodiment of the present principles. The method 100 can be performed, for example, by a computer processing system. In one embodiment, the computer processing system can be any of system 200 of FIG. 2 and/or system 300 of FIG. 3.

In one embodiment, input data may be received in block 102. For example, the input data may include high-dimensional heterogeneous time series data and/or a data set. In one embodiment, input data may include a data matrix $X \in R^{m \times n}$, where R is any real number, m is the number of time series data points, and n is the number of dictionary atoms in dictionary D. In one embodiment, $\lambda$, $\gamma$, $D_0$ may be initialized, where $\lambda$ is a parameter to control the regularization term (e.g., $\lambda$ is a non-negative number), $\gamma$ is a parameter to control the regularization term (e.g., $\gamma$ is a non-negative number), and $D_0$ is an initialization of dictionary D used to start the learning process.

In one embodiment, at least one a priori over-complete dictionary $\Phi$ may be provided for regularization for the learned dictionary in block 104. For example, the a priori over-complete dictionary Φ may be generated by using a Discrete Cosine Transform ("DCT") and/or Haar wavelet basis methods. A DCT method may express a finite sequence of data points in terms of a sum of cosine functions oscillating at different frequencies and/or amplitudes. More particularly, a DCT method may use only real numbers and may need fewer cosine functions to approximate a typical signal. In a Haar wavelet method, a sequence of rescaled "square-shaped" functions may be used to form a wavelet family or basis. Wavelet analysis may allow a target function over an interval to be represented in terms of an orthonormal function basis. In Haar wavelet analysis, any continuous real function with compact support may be approximated uniformly by linear combinations.

In one embodiment, with reference to the dictionary learning problem in equation (2), namely:

$$\{\hat{D}, \hat{W}\} = \arg\min_{D \in C, W} \|X - DW\|_F^2 \quad \text{s.t.} \quad \|W\|_0 \leq k, \quad (2)$$

the constraint C on dictionary D, as represented as D∈C, may regularize dictionary D to avoid trivial solutions, such as W is approximately equal to zero (e.g., W≈0). C may be defined as either (1) for all atoms $d_i$ in the dictionary D (e.g., $\forall d_i \in D$) such that $\|d_i\|_2 \leq c$ or $\|D\|_F \leq c$, where $d_i$ is an atom in dictionary D, c is a threshold value (e.g., a small positive number), D is the dictionary to be learned, and F is the matrix Frobenius norm. In both embodiments, C may prevent the amplitude of dictionary D from being arbitrarily large. However, no prior information or structures of dictionary D are included in this formulation, as provided. For instance, the dictionary learned from image patches may have finer structures, as discrete cosine transform ("DCT") or wavelets.

In one embodiment according to the present principles, using an a priori over-completed dictionary Φ to data set X, a method for hierarchical sparse dictionary learning for heterogeneous high-dimensional time series utilizing the a priori over-completed dictionary Φ to construct a learned dictionary is provided. This method advantageously provides a learned dictionary that may be more adaptive to input data, while being regularized by a priori dictionaries. Furthermore, the present principles provide a method and system for a hierarchical structure wherein the size of the learned dictionary may be determined by the intrinsic complexity of a data set and may need less training samples, which, in other words, may provide a more robust result and less demanding computational cost.

In one embodiment, a hierarchical structure on {X,D,Φ}, such as φ, may be used as the "building blocks" for dictionary D, as well as dictionary D for data set X. For example, the atoms from an a priori over-completed dictionary Φ, which may capture a large variety of shapes, structures, and dynamics at different granularities in a principled way, may be used as building blocks of heterogeneous time series in data set X. By using such an over-complete dictionary Φ for regularization on the learned dictionary, the learned dictionary may have a better capability of characterizing the heterogeneity exhibited in the data set X, including the heterogeneity exhibited in time series data. For example, the learned dictionary may be constructed from atoms in the a priori over-complete dictionary while adapted to the time series data (e.g., based on the characteristics of the time series data, the learned dictionary may select and combine the best atoms from the a priori over-complete dictionary Φ).

In block 106, for t=0, 1, 2, . . . , where t is the t-th iteration/step, sparse coding may be performed on the a priori over-complete dictionary Φ to provide a sparse coded dictionary. During sparse coding, sparse coefficients W with a fixed dictionary D may be determined from the last iteration. For example, a constraint may be used to provide a sparse coded dictionary which is sparse with respect to the a priori over-complete dictionary Φ (e.g., it only utilizes a few atoms from the a priori over-complete dictionary Φ). In one embodiment, the constraint C on dictionary D may be written as:

$$C = \{D = \Phi U, \|u_i\|_0 \leq l, \forall i\} \quad (3)$$

where U is the sparse coefficient for dictionary D, Φ is the priori over-completed dictionary, $u_i$ is the i-th column of U, i is the index, and l is a threshold value (e.g., a small positive number). However, because C may not be a convex feasible region and may not be path connected, optimization on C may become complicated. A convex feasible region is a set of all possible points (e.g., feasible points) of an optimization problem that satisfies the problem's constraints wherein, for example, a line segment connecting any two feasible points goes through only other feasible points and not through any points outside the feasible set. Similarly, a function is path-connected if, for example, two points can be connected or joined by a path.

In accordance with one embodiment, to avoid optimization on the constraint C, the constraint C, as defined in equation (3), may be reformulated as a regularizer in the objective function, and its convex approximation may be considered. In one embodiment, using a $l_1$ convex relaxation of $\|\cdot\|_0$, the C-function of dictionary D may be defined as:

$$C(D) = \sum_i \min_{d_i} \|u_i\|_1 = \min_D \sum \|U\|_1 \quad \text{s.t.} \quad D = \Phi U. \quad (4)$$

Accordingly, the dictionary learning problem, as defined in equation (2), may then be rewritten as:

$$\{\hat{D}, \hat{W}\} = \arg\min_{D,W} \frac{1}{2}\|X - DW\|_F^2 + \gamma C(D) \quad \text{s.t.} \quad \|W\|_0 \leq k. \quad (5)$$

In one embodiment, the convex approximation of C(D) may be considered. For example, assuming a d×p an priori over-complete dictionary Φ has an incoherence μ, where d is the number of dimensions of each time series data point and p is the number of dictionary atoms in an a priori over-complete dictionary Φ, and D=ΦU, with all $u_i$ k-sparsity and $$k < 1 + \frac{1}{\mu},$$

then:

$$\alpha \|\Phi^T D\|_1 \leq \|U\|_1 \leq \beta \|\Phi^T D\|_1,$$

where T is a matrix transpose, α is a constant defined as $$\alpha = \frac{1}{1 + (p-1)\mu},$$

and β is a constant defined as $$\beta = \frac{1}{1-(k-1)\mu}.$$

In particular, if the a priori over-complete dictionary Φ is an orthonormal basis (e.g., unit vectors orthogonal to each other), then $\|U\|_1 = \|\Phi^T D\|_1$. Othogonal is the relation of two lines at right angles to one another (e.g., perpendicular) describing non-overlapping, uncorrelated, or independent objects.

In one embodiment, since the a priori over-completed dictionary Φ may be a pre-designed dictionary with well-constrained incoherence (e.g., constrained lack of orderly arrangement), $\|\Phi^T D\|_1$ may be chosen to regularize the sparsity of dictionary D on the a priori over-completed dictionary Φ. Furthermore, in one embodiment, the sparse constraint of the data representation W over the dictionary D may be reformulated as a regularizer in the objective function. The resulting dictionary learning problem may be defined as:

$$\{\hat{D}, \hat{W}\} = \operatorname*{argmin}_{D,W} f(D,W) = \operatorname*{argmin}_{D,W} \frac{1}{2}\|X - DW\|_F^2 + \lambda\|W\|_1 + \gamma\|\Phi^T D\|_1. \quad (6)$$

Thus, due to the convexity of $\|\Phi^T D\|_1$, the objective function may remain convex in respect to dictionary D.

In one embodiment, an optimal learned dictionary $\hat{D}$ regularized by the a priori over-complete dictionary Φ may be provided in step 104. The optimal learned dictionary $\hat{D}$ may be determined by measuring the difference between the representation W (e.g., coding) using the dictionary D and the original data set X (e.g., $\|X-DW\|_F^2$). In addition, in yet another embodiment, the optimal learned dictionary $\hat{D}$ may be determined by including the $l_1$ regularization on the representation W, which may enforce that the representation W should be sparse (e.g., many zeros in the representation W). In a further embodiment, the optimal learned dictionary $\hat{D}$ may be determined by including the $l_1$ regularization on the a priori over-complete dictionary after the t-th iteration $\Phi^T$ and dictionary D, which may enforce that the learned dictionary picks only a few, but critical, atoms from the a priori over-complete dictionary Φ to construct the learned dictionary's atoms.

Typically, regularization is a process by which additional information is introduced to solve an ill-conditioned problem and/or to prevent overfitting. Regularization methods may be used for model selection to prevent overfitting by penalizing models with extreme parameter values. A variant in regularization methods includes the $l_1$ regularization, which may produce sparse models and may perform feature selection within the learning algorithm. The presence of the $l_1$ regularization term may be used to induce sparsity in the optimal solution. With reference to the objective function in equation (6), sparse coding may be represented by:

$$\hat{W} = \operatorname*{argmin}_{W} \frac{1}{2}\|X-DW\|_F^2 + \lambda\|W\|_1, \quad (7)$$

where equation (7) is a classical linear inversion problem with $l_1$ regularization.

In one embodiment, sparse coding may be performed using a Fast Iterative Shrinkage-Threshold Algorithm ("FISTA") for $l_1$ regularized least squares. For example, FISTA may be used to solve equation (7) for its efficiency and robustness, and may provide a method for a faster rate of convergence with respect to the number of iterations needed to achieve a given accuracy. The least-squares ("LS") approach is a method that may be used to fit a generalized linear model. For example, the LS method in regression analysis may utilize an estimator to minimize data error.

In one embodiment, the sparse coded dictionary may be updated in block 108 to provide a learned dictionary. For example, the sparse coded dictionary may be updated with regularization via auxiliary variables. In one embodiment, during the dictionary update stage, dictionary D may be optimized in regard to the pursued representation W. In one embodiment, the objective function in equation (6) may be rewritten to eliminate the terms in which the dictionary D is not involved (e.g., $\|W\|_1$). For example, the objective function in equation (6) may be rewritten as:

$$\hat{D} = \operatorname*{argmin}_{D} \frac{1}{2}\|X-DW\|_F^2 + \gamma\|\Phi^T D\|_1. \quad (8)$$

In one embodiment, an auxiliary variable H, where $H_t = \Phi^T D_t$, may be utilized, where T is the matrix transpose, $H_t$ is the learned auxiliary variable after the t-th iteration, $\Phi^T$ is the a priori over-complete dictionary, and $D_t$ is the learned dictionary after the t-th iteration. Accordingly, equation (8) may be rewritten as:

$$\hat{H} = \operatorname*{argmin}_{H} \frac{1}{2}\|X - \Phi^\dagger HW\|_F^2 + \gamma\|H\|_1, \quad (9)$$

$$\hat{D} = \Phi^\dagger \hat{H}, \quad (10)$$

where $\hat{H}$ is the optimal estimation of the auxiliary variable H, † is a matrix pseudo inverse, and $\Phi^\dagger = (\Phi\Phi^T)^{-1}\Phi$. Instead of solving the objective function in equation (8) directly, the auxiliary variable H may be determined first. Once the auxiliary variable H has been determined, the auxiliary variable H may be used to determine the optimal estimation of dictionary D.

In a further embodiment, the auxiliary variable H and the optimal estimation of dictionary D may be minimized in an alternating method for each t-th iteration, thereby providing a faster update. For example, updating the sparse coded dictionary in block 108 includes alternating between a first auxiliary variable at a first iteration and a subsequent auxiliary variable at a subsequent iteration. The first auxiliary variable H may be solved based on the dictionary from last iteration. Then the dictionary in a subsequent iteration may be solved based on the newly solved auxiliary variable. It should be understood, therefore, that "alternating" means each auxiliary variable is solved from another auxiliary variable in a previous iteration. It should also be noted that $\Phi\Phi^T$ is invertible since the a-priori over-complete dictionary Φ is an over-completed frame. Accordingly, this is a linear inverse problem with $l_1$ regularization.

In a further embodiment, the $l_1$-penalized objective function may employ a variable selection procedure to select the most important dictionary atoms that contribute to error reduction during the dictionary update step of block 108. For example, the $l_1$ regularizer may affect the atoms in dictionary D during the dictionary update step in block 108. In one embodiment, the obsolete and/or less important atoms in dictionary D may be automatically eliminated during the dictionary update step in block 108, and the size of dictionary D may be thereby well-controlled. For example, for any atom $d_i$ in the dictionary D (e.g., $d_i \in D$), if any one atom degenerates to zero (e.g., $d_i^t = 0$), then such atom may continuously degenerate to zero (e.g., $d_i^{t+1} = 0$). Therefore, any obsolete and/or unused atoms may be automatically set to zero and eliminated from the learned dictionary, thereby pruning the dictionary D during the dictionary update of block 108.

In one embodiment, if one atom does not contribute significantly to the reduction of empirical error, e.g., $r(D, W) = \|X - DW\|$, then the atom may be set to zero during the dictionary update set in block 108. For example, at iteration $t_0$, if $\|\Phi^T R_i W^T\|_\infty < \gamma$, where $R_i = X - D_{-i} W_{-i}$, then $d_i = 0$ for $t \geq t_0$. Therefore, the unnecessary atoms may degenerate to zero as the empirical error reduces and a compact dictionary may be maintained in an on-line fashion during the update dictionary step of block 108. Thus, in one embodiment, letting data set X be of dimension d×m, dictionary D be of dimension d×n, and the a priori over-complete dictionary $\Phi$ be of dimension d×p, results in m>p>n and m>d, p>d, where d is the number of dimensions of each time series data point, m is the number of time series data points in data set X, n is the number of dictionary atoms in dictionary D, and p is the number of dictionary atoms in the a priori over-complete dictionary $\Phi$.

In a further embodiment, the convergence of the learned dictionary to data set X may be determined in block 110. For example, if convergence has been achieved (e.g., "Yes" at block 110), then processing may continue to block 112. If, on the other hand, convergence has not been achieved (e.g., "No" at block 110), then the process may be returned to the sparse coding step of block 106. In yet a further embodiment, if convergence has not been achieved (e.g., the learned dictionary lacks convergence), the steps of performing sparse coding (block 106), updating the sparse coded dictionary (block 108), and determining whether the learned dictionary converges to the input data set (block 110) may be repeated.

In one embodiment, an optimized learned dictionary regularized by an a priori hand-crafted over-complete dictionaries may be output in block 112. The learned dictionary may have a hierarchical sparse structure and may be optimized to adapt to input data. Accordingly, the method for hierarchical sparse dictionary learning 100 may reduce overfitting, enhance the generalizability of the learned dictionary, and may provide a more robust sparse representation. Moreover, the present principles may characterize high-dimensional time series, where the time series data exhibits high heterogeneity in nature, e.g., continuous versus discrete, smooth versus non-smooth, stationary versus non-stationary, etc.

Figure 2:
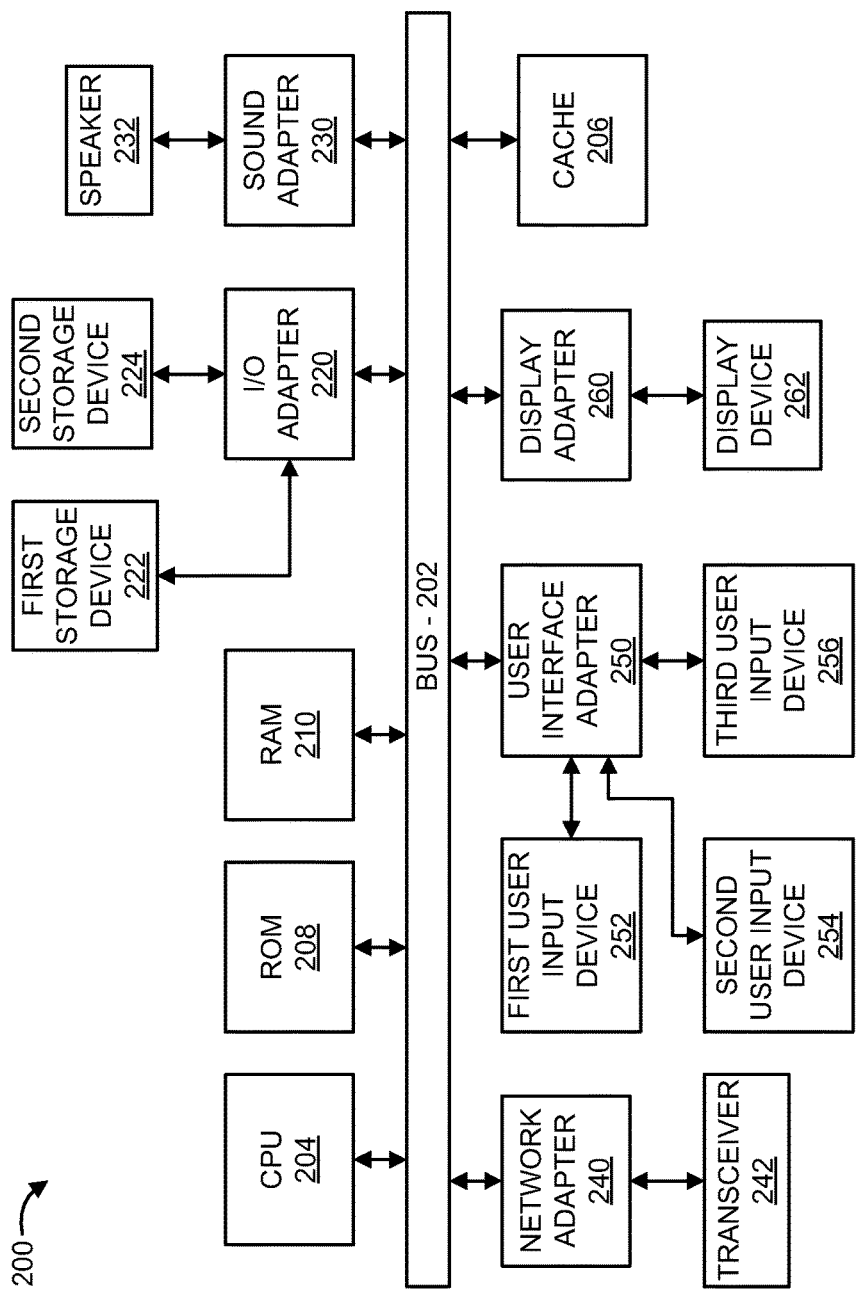
FIG. 2 shows an exemplary processing system to which the present principles may be applied, in accordance with one embodiment.

Referring now to FIG. 2 with continued reference to FIG. 1, in another embodiment according to the present principles, an exemplary processing system 100 to which the present principles may be applied, is illustratively depicted in accordance with one embodiment of the present principles. The processing system 200 includes at least one processor ("CPU") 204 operatively coupled to other components via a system bus 202. A cache 206, a Read Only Memory ("ROM") 208, a Random Access Memory ("RAM") 210, an input/output ("I/O") adapter 220, a sound adapter 230, a network adapter 240, a user interface adapter 250, and a display adapter 260, are operatively coupled to the system bus 202.

A storage device 222 and a second storage device 224 are operatively coupled to system bus 202 by the I/O adapter 220. The storage devices 222 and 224 can be any of a disk storage device (e.g., a magnetic or optical disk storage device), a solid state magnetic device, and so forth. The storage devices 222 and 224 can be the same type of storage device or different types of storage devices.

A speaker 232 is operatively coupled to system bus 202 by the sound adapter 230. A transceiver 242 is operatively coupled to system bus 202 by network adapter 240. A display device 262 is operatively coupled to system bus 202 by display adapter 260.

A first user input device 252, a second user input device 254, and a third user input device 256 are operatively coupled to system bus 202 by user interface adapter 250. The user input devices 252, 254, and 256 can be any of a keyboard, a mouse, a keypad, an image capture device, a motion sensing device, a microphone, a device incorporating the functionality of at least two of the preceding devices, and so forth. Of course, other types of input devices can also be used. The user input devices 252, 254, and 256 can be the same type of user input device or different types of user input devices. The user input devices 252, 254, and 256 are used to input and output information to and from system 200.

Of course, the processing system 200 may also include other elements (not shown), as readily contemplated by one of skill in the art, as well as omit certain elements. For example, various other input devices and/or output devices can be included in processing system 200, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 200 are readily contemplated by one of ordinary skill in the art given the teachings of the present principles provided herein.

Figure 3:
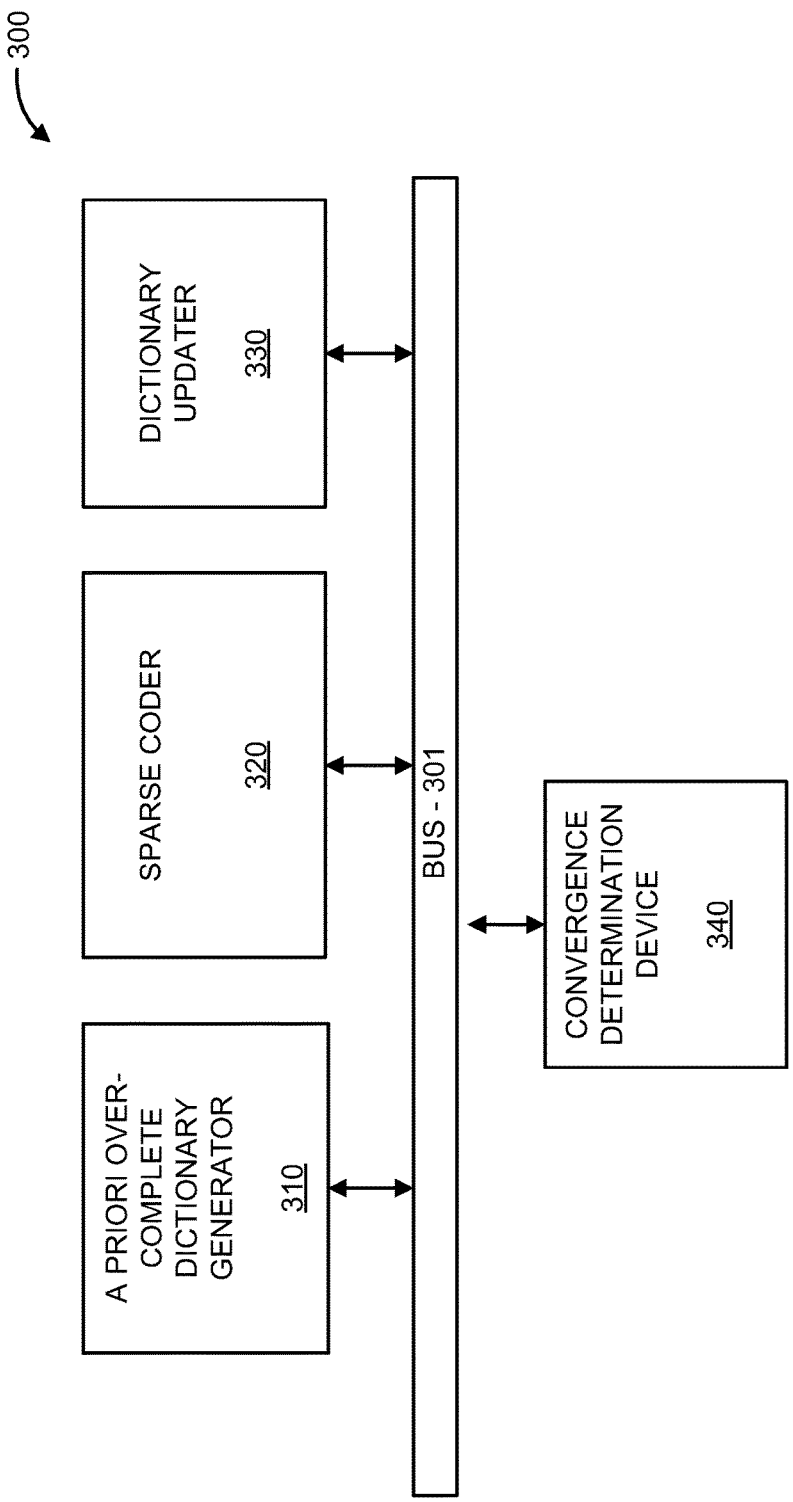
FIG. 3 shows an exemplary system for constructing a learned dictionary regularized by at least one a priori over-complete dictionary for hierarchical sparse dictionary learning ("HiSDL"), in accordance with one embodiment.

Moreover, it is to be appreciated that system 300 described below with respect to FIG. 3 is a system for implementing respective embodiments of the present principles. Part or all of processing system 200 may be implemented in one or more of the elements of system 300.

Further, it is to be appreciated that processing system 200 may perform at least part of the method described herein including, for example, at least part of method 100 of FIG. 1. Similarly, part or all of system 300 may be used to perform at least part of method 100 of FIG. 1.

FIG. 3 shows an exemplary system 300 for constructing a learned dictionary regularized by at least one a priori over-complete dictionary for hierarchical sparse dictionary learning ("HiSDL"), in accordance with one embodiment of the present principles. While many aspects of system 300 are described in singular form for the sake of illustration and clarity, the same can be applied to multiples ones of the items mentioned with respect to the description of system 300. For example, while at least one a priori over-complete dictionary is mentioned with respect to the a priori over-complete dictionary generator 310, more than one a priori over-complete dictionary may be used in accordance with the teachings of the present principles. Moreover, it is appreciated that the at least one a priori over-complete dictionary is but one aspect involved with system 300 than can be extended to plural form while maintaining the spirit of the present principles.

The system 300 may include an a priori over-complete dictionary generator 310, a sparse coder 320, a dictionary updater 230, and a convergence determination device 340.

The a priori over-complete dictionary generator 310 may provide and/or generate at least one a priori over-complete dictionary for regularization. The a priori over-complete dictionary may be provided using at least one of a Discrete Cosine Transform ("DCT") or a Haar wavelet basis. These and other variations between configurations are readily determined by one of ordinary skill in the art given the teachings of the present principles provided herein, while maintaining the present principles.

The sparse coder 320 may perform sparse coding of the at least one a priori over-complete dictionary Φ to provide a sparse coded dictionary. In one embodiment, sparse coding may involve actions using a Fast Iterative Shrinkage-Threshold ("FISTA") approach for $l_1$ regularized least squares. The dictionary updater 330 may update the sparse coded dictionary using a regularization approach with auxiliary variables to provide a learned dictionary. In a further embodiment, dictionary updater 330 may update the sparse coded dictionary by minimizing the auxiliary variable H and the optimal estimation of dictionary D in an alternating method for each t-th iteration, thereby providing a faster update. For example, the dictionary updater 330 is configured to update the sparse coded dictionary by alternating between a first auxiliary variable at a first iteration and a subsequent auxiliary variable at a subsequent iteration.

In a further embodiment, the dictionary updater 330 may employ a variable selection procedure to select the most important dictionary atoms that contribute to error reduction. In one embodiment, the dictionary updater 330 is configured to eliminate the obsolete and/or less important atoms in dictionary D, and the size of dictionary D may be thereby well-controlled. For example, for any atom $d_i$ in the dictionary D, if any one atom degenerates to zero, then the dictionary updater 330 may set such atom to continuously degenerate to zero. Therefore, the dictionary updater 330 may set any obsolete and/or unused atoms to zero and eliminate such atom(s) from the learned dictionary, thereby pruning the dictionary D. In one embodiment, if one atom does not contribute significantly to the reduction of empirical error, the dictionary updater 330 may set such atom to zero.

The convergence determination device 340 may determine the convergence of the learned dictionary to the input data set. For example, if the convergence determination device 340 determines that convergence of the learned dictionary to the input data set has been achieved, then processing may continue. If, on the other hand, the convergence determination device 340 determines that convergence of the learned dictionary to the input data set has not been achieved (e.g., lack of convergence), the convergence determination device 340 may return the learned dictionary to the sparse coder 320. In yet a further embodiment, if the convergence determination device 340 determines that convergence has not been achieved (e.g., the learned dictionary lacks convergence), the sparse coder 320 is further configured to repeat the sparse coding, the dictionary updater 330 is further configured to repeat the update, and the convergence determination device 340 is further configured to repeat the convergence determination.

System 300 may output a learned dictionary regularized by the a priori over-complete dictionaries, which in one embodiment may be displayed on a display device 262 of FIG. 2. It should be noted that while the above configuration is illustratively depicted, it is contemplated that other sorts of configurations may also be employed according to the present principles.

In the embodiment shown in FIG. 3, the elements thereof are interconnected by a bus 301. However, in other embodiments, other types of connections can also be used. Moreover, in one embodiment, at least one of the elements of system 300 is processor-based. Further, while one or more elements may be shown as separate elements, in other embodiments, these elements can be combined as one element. The converse is also applicable, where while one or more elements may be part of another element, in other embodiments, the one or more elements may be implemented as standalone elements. These and other variations of the elements of system 300 are readily determined by one of ordinary skill in the art, given the teachings of the present principles provided herein, while maintaining the spirit of the present principles.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. Additional information is provided in an appendix to the application entitled, "Additional Information". It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

What is claimed is:

1. A method for hierarchical sparse dictionary learning ("HiSDL") to construct a learned dictionary regularized by an a priori over-complete dictionary, comprising:
    providing at least one a priori over-complete dictionary for regularization;
    performing sparse coding of the at least one a priori over-complete dictionary to provide a sparse coded dictionary;
    using a processor, updating the sparse coded dictionary with regularization using auxiliary variables to provide a learned dictionary;
    determining whether the learned dictionary converges to an input data set; and
    outputting the learned dictionary regularized by the at least one a priori over-complete dictionary when the learned dictionary converges to the input data set.

2. The method of claim 1, further comprising:
    when the learned dictionary lacks convergence, repeating the steps of performing sparse coding, updating the sparse coded dictionary, and determining whether the learned dictionary converges to the input data set.

3. The method of claim 1, wherein the input data set includes at least one of high-dimensional heterogeneous time series data and a data matrix.

4. The method of claim 3, wherein the learned dictionary includes atoms from the at least one a priori over-complete dictionary which are adapted to the high-dimensional heterogeneous time series data.

5. The method of claim 1, wherein providing the at least one a priori over-complete dictionary includes using at least one of a Discrete Cosine Transform ("DCT") and a Haar wavelet basis to provide the at least one a priori over-complete dictionary.

6. The method of claim 1, wherein performing the sparse coding of the at least one a priori over-complete dictionary includes using a Fast Iterative Shrinkage-Threshold ("FISTA") approach for $l_1$ regularized least squares.

7. The method of claim 1, wherein updating the sparse coded dictionary includes alternating between a first auxiliary variable at a first iteration and a subsequent auxiliary variable at a subsequent iteration.

8. The method of claim 1, wherein updating the sparse coded dictionary further comprises eliminating obsolete atoms in the learned dictionary if any one atom in the input data set degenerates to zero.

9. The method of claim 8, wherein any one atom in the input data set degenerates to zero if the atom does not reduce empirical error.

10. A system for hierarchical sparse dictionary learning ("HiSDL") to construct a learned dictionary regularized by an a priori over-complete dictionary, the system comprising:
    an a priori over-complete dictionary generator configured to provide at least one a priori over-complete dictionary for regularization;
    a sparse coder configured to perform sparse coding of the at least one a priori over-complete dictionary to provide a sparse coded dictionary;
    using a processor, a dictionary updater configured to update the sparse coded dictionary with regularization using at least one auxiliary variable to provide a learned dictionary;
    a convergence determination device configured to determine convergence of the learned dictionary to an input data set; and
    an output device configured to output the learned dictionary regularized by the at least one a priori over-complete dictionary when the learned dictionary converges to the input data set.

11. The system of claim 10, wherein, when the learned dictionary lacks convergence:
    the sparse coder is further configured to repeat the sparse coding;
    the dictionary updater is further configured to repeat the update; and
    the convergence determination device is further configured to repeat the convergence.

12. The system of claim 10, wherein the input data set includes at least one of high-dimensional heterogeneous time series data and a data matrix.

13. The system of claim 12, wherein the learned dictionary includes atoms from the at least one a priori over-complete dictionary which are adapted to the high-dimensional heterogeneous time series data.

14. The system of claim 10, wherein the a priori over-complete dictionary generator is further configured to generate the at least one a priori over-complete dictionary using at least one of a Discrete Cosine Transform ("DCT") or and a Haar wavelet basis.

15. The system of claim 10, wherein the sparse coder is further configured to perform sparse coding of the at least one a priori over-complete dictionary using a Fast Iterative Shrinkage-Threshold ("FISTA") approach for $l_1$ regularized least squares.

16. The system of claim 10, wherein the dictionary updater is further configured to update the sparse coded dictionary by alternating between a first auxiliary variable at a first iteration and a subsequent auxiliary variable at a subsequent iteration.

17. The system of claim 10, wherein the dictionary updater is further configured to eliminate obsolete atoms in the learned dictionary if any one atom in the input data set degenerates to zero.

18. The system of claim 17, wherein any one atom in the input data set degenerates to zero if the atom does not reduce empirical error.

19. A computer program product is provided that includes a non-transitory computer readable storage medium having computer readable program code embodied therein for a method for hierarchical sparse dictionary learning ("HiSDL") to construct a learned dictionary regularized by an a priori over-complete dictionary, the method comprising:
    providing at least one a priori over-complete dictionary for regularization;
    performing sparse coding of the at least one a priori over-complete dictionary to provide a sparse coded dictionary;
    using a processor, updating the sparse coded dictionary with regularization using at least one auxiliary variables to provide a learned dictionary;
    determining whether the learned dictionary converges to an input data set; and
    outputting the learned dictionary regularized by the at least one a priori over-complete dictionary when the learned dictionary converges to the input data set.

20. The computer program product of claim 19, further comprising:
    when the learned dictionary lacks convergence, repeating the steps of performing sparse coding, updating the sparse coded dictionary, and determining whether the learned dictionary converges to the input data set.

* * * * *